United States Patent
Makita et al.

[11] Patent Number: 6,043,655
[45] Date of Patent: Mar. 28, 2000

[54] MR IMAGING UTILIZING THE TIME OF FLIGHT EFFECT

[75] Inventors: Junichi Makita, Tokyo; Fumitoshi Kojima, Otawara, both of Japan

[73] Assignee: Kabushiki Kaisha Toshiba, Kawasaki, Japan

[21] Appl. No.: 09/004,862

[22] Filed: Jan. 9, 1998

[30] Foreign Application Priority Data

Jan. 9, 1997 [JP] Japan .................................. 9-001801

[51] Int. Cl.$^7$ .................................................. G01V 3/00
[52] U.S. Cl. ........................... 324/309; 324/307; 600/408
[58] Field of Search .................... 324/309, 307, 324/306, 314; 600/408, 413, 410, 411

[56] References Cited

U.S. PATENT DOCUMENTS

| 5,417,213 | 5/1995 | Prince | 324/309 |
| 5,590,654 | 1/1997 | Prince | 324/309 |

OTHER PUBLICATIONS

Prince, "Gadolinium–Enhanced MR Aortography", Radiology 1994, 191;155–164.
Pike et al, "Magnetization Transfer Time–of–Flight Magnetic Resonance Angiography", Magnetic Resonance in Medicine 25, 372–379 (1992).

Primary Examiner—Jay Patidar
Assistant Examiner—Brij B. Shrivastav
Attorney, Agent, or Firm—Nixon & Vanderhye P.C.

[57] ABSTRACT

Time-Of-Flight (TOF) MRI techniques are used to enhance blood flows into one of a pair of images for a given plane or slice of a patent's body. Arithmetic subtraction of such images produces a resultant image of substantially only blood flows since images of fat or other tissue are thus nulled out of the resultant image. All basic MRI sequences (e.g., FE, SE, etc.) can be used in conjunction with a pre-pulse on additional sub-sequences in a plane displaced from the objective plane to be imaged. Both arterial and venous blood flows can be imaged (separately or together in one resultant image). Color coding can be used in the resultant images to distinguish blood flow directions and/or velocities.

38 Claims, 11 Drawing Sheets

MR IMAGING UTILIZING THE TIME OF FLIGHT EFFECT

BACKGROUND OF THE INVENTION

1. Field of the Invention

The present invention relates to a magnetic resonance imaging technique for imaging the inside of a subject on the basis of a magnetic resonance phenomenon occurring in the subject. More particularly, this invention is concerned with a magnetic resonance imaging (MRI) system and magnetic resonance (MR) imaging method based on the time of flight effect of nuclear spins residing in blood flow passing through two-dimensional planes to be imaged of the subject.

2. Description of the Related Art

Magnetic resonance imaging is a technique for magnetically exciting nuclear spins in a subject positioned in a static magnetic field by applying a radio-frequency signal with the Larmor frequency, and reconstructing an image using an MR signal induced with the excitation or providing a spectrum of an MR signal.

In the MRI field, techniques for imaging blood flow of a subject have already been in practical use in medical examination. One blood flow imaging technique is based on the two-dimensional time of flight(2D-TOF) effect, which utilizes simple changes in positions of nuclear spins existing within blood vessels. Using this technique, two-dimensional images associated with blood flow are produced and maximum intensity projection (MIP) images and/or rotational images of blood vessels are obtained from three-dimensional images formed by virtually piling up a plurality of two-dimensional images.

The two-dimensional time of flight (2D-TOF) method is particularly effective when flows of blood are perpendicular or thereabout to a sliced plane to be imaged, and adequate for the observation of blood flow over the wider range in the body axis direction of a subject. Pulse sequences used in scanning to produce the 2D-TOF use a rephase pulse for imaging two-dimensional regions at specified slice positions.

In human bodies taken as the subject, the speed of blood flow in peripheral blood vessels is slower. In such case, the depiction of blood flow based on the time of flight effect can be performed by adjusting the slice thickness values and flip angles in imaging.

According to the 2D-TOF method, for example, when the blood flow speed, as in blood flow through the inferior limb, is slower, relatively higher flip angles (nearer to 90 degrees) are employed to raise contrast levels. However, the higher the flip angle becomes, the larger are the intensities of an MR signal induced from surrounding fat of vessels, thus providing a problem in that the MR signal from the fat should be removed for carrying out maximum intensity projection processes employed as a one post-process. If the MR signals from fat are higher in intensities, then they are modulated into higher brightness values, providing a problem in that the MR signal from fat is excessively enhanced and the like, and thus deteriorating the depiction ability of blood vessels. In the 2D-TOF method, if a region to be imaged is narrow, the MR signal from fat can suitably be suppressed; on one hand, if the region is wide, it is almost impossible to suitably suppress the MR signal from fat in a uniform manner over the wide region.

There is a countermeasure to suppress the MR signal from fat. Prior to applying a pulse sequence for acquiring MR signals for image reconstruction (frequently, referred to as a main scan), a pre-pulse is applied for suppressing the MR signal to be induced from fat. However, mere application of the pre-pulse will lead to poor resolution and/or visibility of blood flow images.

SUMMARY OF THE INVENTION

The present invention attempts to break through the foregoing current situation of known art. Specifically, an object of the present invention is to obtain blood flow images, whose visibility and distinguishability of blood vessels are improved, by sustaining the clearness of imaged blood vessels themselves and suppressing the MR signal to be induced from tissues, such as fat and muscle.

Another object of the present invention is to obtain blood flow images, whose visibility and distinguishability of blood vessels are improved, by not only performing MR imaging in higher speed regions of blood flows, thus acquiring higher-level MR signals from the blood flow and raising a signal to noise ratio for blood flow, but also by suppressing the MR signal to be induced from other tissues, such as fat and muscle.

Still another object of the present invention is to raise signal levels induced from blood flow by a steadily-tracing scan of blood flow in ECG (electrocardiograpic) gated imaging, improving signal to noise ratio.

For accomplishing the above objects, one aspect of the present invention relates to MRI for producing an image of a magnetically sliced two-dimensional objective plane of a subject, comprising: first means for executing, every specified phase-encoding amount, a first pulse sequence being set so as to acquire an echo signal being generated in response to selective excitation of nuclear spins in the objective plane; second means for executing, prior to or after the first pulse sequence, every specified phase-encoding amount, a second pulse sequence including a pre-pulse pre-exciting nuclear spins in a two-dimensional plane different from the objective plane and being set to acquire an echo signal being generated in response to selective excitation of nuclear spins in the objective plane after application of the pre-pulse; and means for processing the echo signals produced by the first and second executing means into an image of the objective plane.

Preferably, each of the first and second pulse sequences executed by the first and second executing means includes a gradient applied in a read-out direction and the gradient includes a rephase pulse formed by reversing a polarity of the gradient. In this case, it is preferred that the gradient applied in the read-out direction includes a read-out pulse applied after the rephase pulse and based on a field echo (FE) method. It is also preferred that each of the first and second pulse sequences executed by the first and second executing means includes an RF exciting pulse used under a flip angle of less than 90 degrees against the spins exposed to the selective excitation.

Still, preferred is that each of the first and second executing means is composed such that the objective plane is positioned against a flow of blood employed as the flow of fluid at an intersection angle of 90 degrees or thereabout.

Still further, for example, it is preferred that the second executing means comprises means for setting the pre-pulse applied plane positioned at a vein-inflowing side of the objective plane, the vein being employed as the flow of blood; and the processing means comprises means for reconstructing the echo signal acquired by the first executing means into a first image of the objective plane, means for reconstructing the echo signal acquired by the second executing means into a second image of the objective plane, and means for subtracting in each corresponding pixel value the second image from the first image in order to produce a subtraction image.

As another aspect of the present invention, there is a method of MR imaging for producing an image of a magnetically sliced two-dimensional objective plane of a subject, comprising the steps of: executing, every specified phase-encoding amount, a first pulse sequence being set so as to acquire an echo signal being generated in response to selective excitation of nuclear spins in the objective plane and, prior to or after the first pulse sequence, a second pulse sequence including a pre-pulse pre-exciting nuclear spins in a two-dimensional plane different from the objective plane and being set to acquire an echo signal being generated in response to selective excitation of nuclear spins in the objective plane after application of the pre-pulse; and processing the echo signals by executing the first and second pulse sequences into the image of the objective plane.

The features of the invention will be clearly understood from the description of various preferred embodiments, which are described with accompanying drawings below.

DESCRIPTION OF THE PREFERRED EMBODIMENTS

Figure 1:
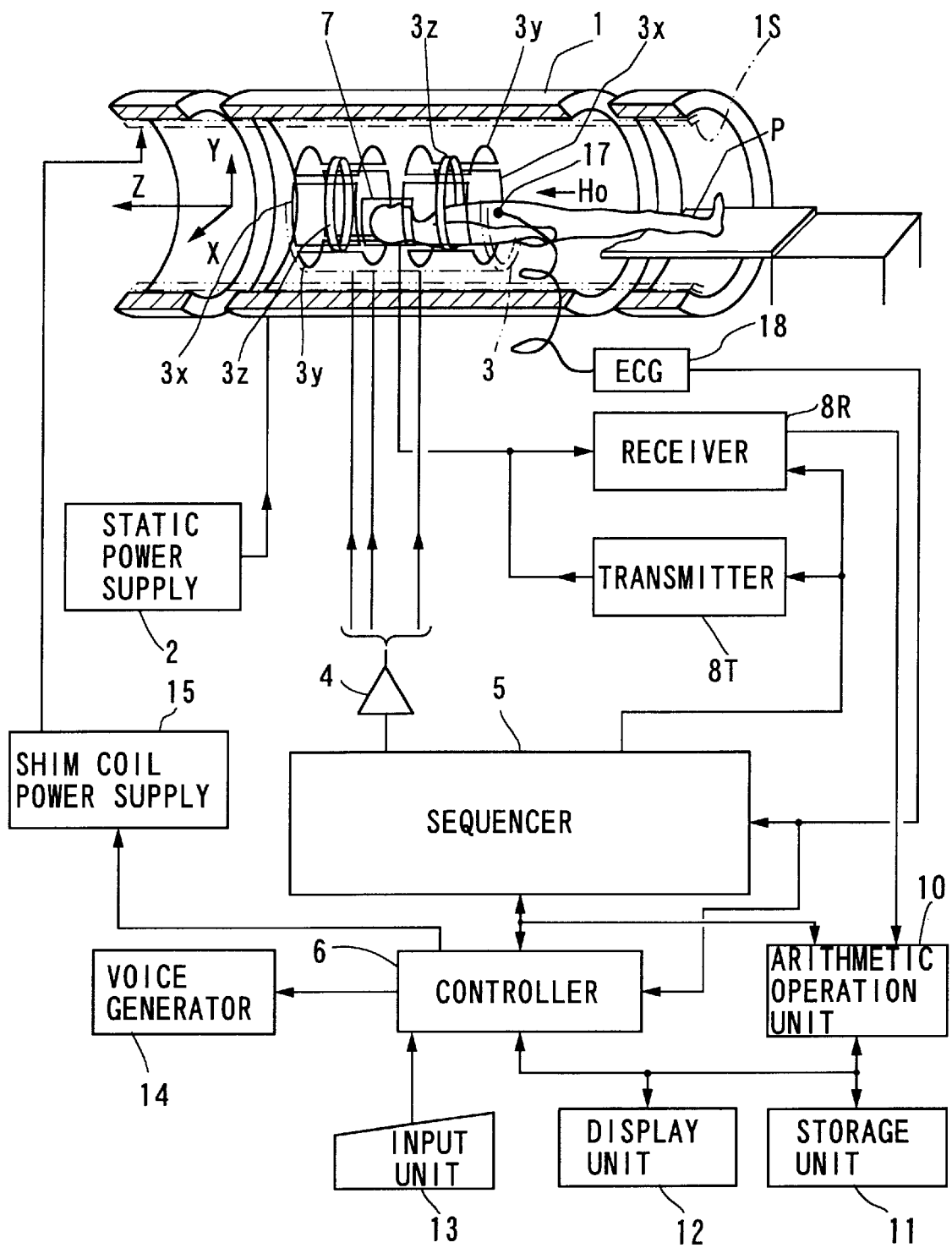
FIG. 1 is a block diagram showing an example of an MRI system in accordance with the embodiments of the present invention.

FIG. 1 shows the outline configuration of a magnetic resonance imaging (MRI) system in accordance with the embodiments of the present invention.

The MRI system comprises a patient couch on which a patient P lies down, static magnetic field generating components for generating a static magnetic field, magnetic field gradient generating components for appending positional information to a static magnetic field, transmitting and receiving components for transmitting and receiving a radio-frequency signal, control and arithmetic operation components responsible for control of the whole system and for image reconstruction, and an electrocardiographing component for acquiring an ECG signal of a patient.

The static magnetic field generating components include a magnet 1 that is of, for example, a superconducting type, and a static power supply 2 for supplying a current to the magnet 1, and which generates a static magnetic field $H_0$ in an axial direction (Z-axis direction) in a cylindrical bore (diagnostic space) into which the patient P is inserted. The magnet unit includes shim coils 1S. A current used to homogenize a static magnetic field is supplied from a shim coil power supply 15 to the shim coils 1S under the control of a controller to be described later. The couch top of the patient couch on which the patient P lies down can be inserted into the bore of the magnet 1 so that the couch top can be withdrawn.

The magnetic field gradient generating components include a gradient coil unit 3 incorporated in the magnet 1. The gradient coil unit 3 includes three pairs (kinds) of x, y, and z coils 3x to 3z used to generate magnetic field gradients changing in strength in X-axis, Y-axis, and Z-axis directions that are mutually orthogonal in the physical coordinate system of the MRI system. The magnetic field gradient generator further includes a gradient power supply 4 for supplying a current to the x, y, and z coils 3x to 3z. The gradient power supply 4 supplies a pulsating current used to generate a magnetic field gradient to the x, y, and z coils 3x to 3z under the control of a sequencer 5 that will be described later.

The pulsating current supplied from the gradient power supply 4 to the x, y, and z coils 3x to 3z is controlled, whereby magnetic field gradients changing in the three axial directions, that is, the X, Y, and Z directions are synthesized. Thus, directions in which a slice magnetic field gradient $G_S$, a phase-encoding magnetic field gradient $G_E$, and a read-out (frequency-encoding) magnetic field gradient $G_R$ are applied can be specified and changed arbitrarily. The magnetic field gradients to be applied in a slice direction, a phase-encoding direction that is a direction in which the distribution of spins is phase-encoded, and a read-out direction that is a direction in which an MR signal is read are superposed on the static magnetic field $H_0$.

The transmitting/receiving components include a radio-frequency coil 7 located in the vicinity of the patient P in the scanning space inside the magnet 1, and a transmitter 8T and receiver 8R connected to the coil 7. The transmitter 8T and receiver 8R supply radio-frequency pulses with the Larmor frequency, which are used to excite magnetic resonance (MR), under the control of the sequencer 5 to be described later, receive an MR signal (radio-frequency signal) via the radio-frequency coil 7, carries out various kinds of signal processing, and then produces a corresponding digital signal.

Furthermore, the control and arithmetic operation components include the sequencer 5, a controller 6, an arithmetic operation unit 10, a storage unit 11, a display unit 12, an input unit 13, and a voice generator 14. Among them, the controller 6 includes a computer. The controller 6 has the function of following a procedure that is a software program stored in the computer so as to command the sequencer 5 to provide pulse-sequence information, matching in timing the operations of the control blocks including the sequencer 5 in the whole system, and managing the control blocks on a centralized basis.

For imaging an objective slice plane of a subject, the MRI system is configured so that; a plurality of signal acquisition stages, are repeated for example, two stages that include of a first stage in which the objective slice plane is scanned every phase-encoding amount using a rephase pulse, and a second stage in which, before or after the first stage, a different slice plane from the objective slice plane (for example, adjacent slice to the objective slice) is pre-excited, then the objective slice plane is scanned every phase-encoding amount using a rephase pulse; echo data of a plurality of frames acquired in the individual scanning stages are reconstructed into a plurality of frames of images; and operation such as subtraction and/or addition is carried out for a plurality of frames of images to produce a final image of the objective slice plane.

Figure 2:
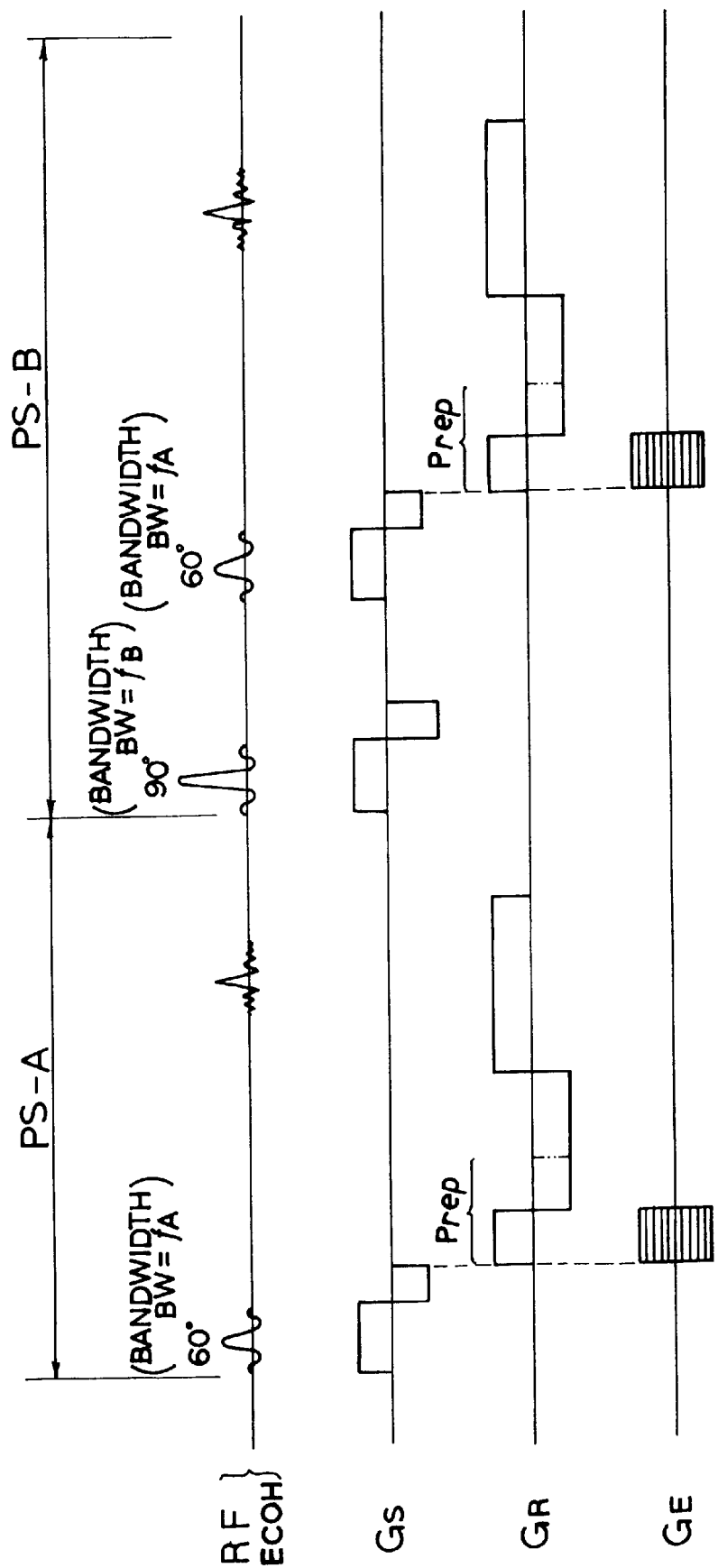
FIG. 2 is an example of a scan sequence to be executed in a first embodiment of the invention.

To accomplish this imaging, the controller 6 and sequencer 5 cooperatively executes, for example, a scan sequence shown in FIG. 2, in which it is divided into the two stages formed from two pulse sequences of a former and latter pulse sequences PS-A and PS-B for each phase-encoding amount. The processing is carried out under a computer-controlled manner during a period when the controller 6 performs a pre-given main program (not shown). The MR signals acquired by performing the scan sequence are processed by the arithmetic operation unit 10 into a final MR image, under processing according to a reconstruction routine schematically shown in FIG. 3, for example.

The sequencer 5 has a CPU and memory, stores scan-sequence information sent from the controller 6, and controls a series of operations to be performed by the gradient power supply 4, transmitter 8R, and receiver 8T according to the stored information. What is referred to scan-sequence information is all information required for operating the gradient power supply 4, transmitter 8R, and receiver 8T according to a scan sequence. For example, scan-sequence information includes information concerning the strength of a pulsating current to be applied to the x, y, and z coils 3x to 3z, and the application time and timing thereof. Still, the sequencer 5 is constructed such that it executes the above-described timing control in synchronism with a gating pulse derived from a latter-described ECG signal of a subject.

As for the scan sequence, a scan sequence used for two-dimensional (2D) scanning will do as long as the Fourier transform can be applied for image reconstruction. The scan sequence may be a pulse train to be applied; the spin echo (SE) train, field gradient echo (FE) train, fast SE (FSE) train, or the like.

The arithmetic operation unit 10 inputs digital raw data corresponding to an MR signal sent from the receiver 8R, maps the raw data in the Fourier space (or the k-space or frequency space) formed in an incorporated memory, and performs a two-dimensional Fourier transform on the raw data so as to reconstruct an image in the real space. Moreover, the arithmetic operation unit 10 carries out arithmetic operation (refer to FIGS. 3 and 4) including addition and/or subtraction of pixel data between frames of images, which is a constituent feature of the present invention. Additionally the arithmetic operation unit 10 carries maximum intensity projection (MIP) processing in which maximum pixel values are selected pixel by pixel from reconstructed image data of a plurality of frames constituting a three-dimensional image data of a volume region scanned, each frame being scanned on the basis of the invention technique.

The storage unit 11 can preserve not only raw data and reconstructed image data but also image data having undergone arithmetic operation. The display unit 12 displays an image, and can be used to input desired information entered at the input unit 13 by an operator; such as, desired scan conditions, a desired scan sequence, and a technique of image processing to the controller 6.

The voice generator 14 utters, for example, a voice message informing the start and end of breath hold in response to a command sent from the controller 6.

The electrocardiographing component is made up of an ECG (electrocardiograph) sensor 17 attached to a patient P and outputting an electric ECG signal of the patient and an ECG sensor 18 outputting a gate pulse as an ECG gating signal to the controller 6 and sequencer 5, the gate pulse having a very small pulse width synchronous with the peak values of R-waves of the ECG signal. The gate pulses are utilized by sequencer 5 as the ECG gating signal to control each start timing of scanning of a plurality of stages per one phase encoding amount. The ECG gated control constitutes part of the invention. The control enables one to set appropriate ECG gated timing making it possible to acquire MR unprocessed (raw) data based on the ECG gated scan.

(First embodiment)

Next, scan control operations in a first embodiment will be described.

When the MRI system is activated, the controller 6 executes a given main program and carries out the processing described in FIG. 2 as part of a not-shown main program. The scan sequence shown in FIG. 2, based on the FE method, includes rephase pulses Prep in the read-out gradient. The application according to the pulse sequence is carried out via the x, y, and z-coil $3x$ to $3z$ and RF coil 7 under the control of the sequencer 5.

As illustrated in the FIG. 2, the whole scan sequence is made up of a former pulse sequence PS-A and a latter pulse sequence PS-B followed by the former one. Alternatively, the execution order of the two pulse sequences PS-A and PS-B may be changed in the opposite way.

Figure 4:
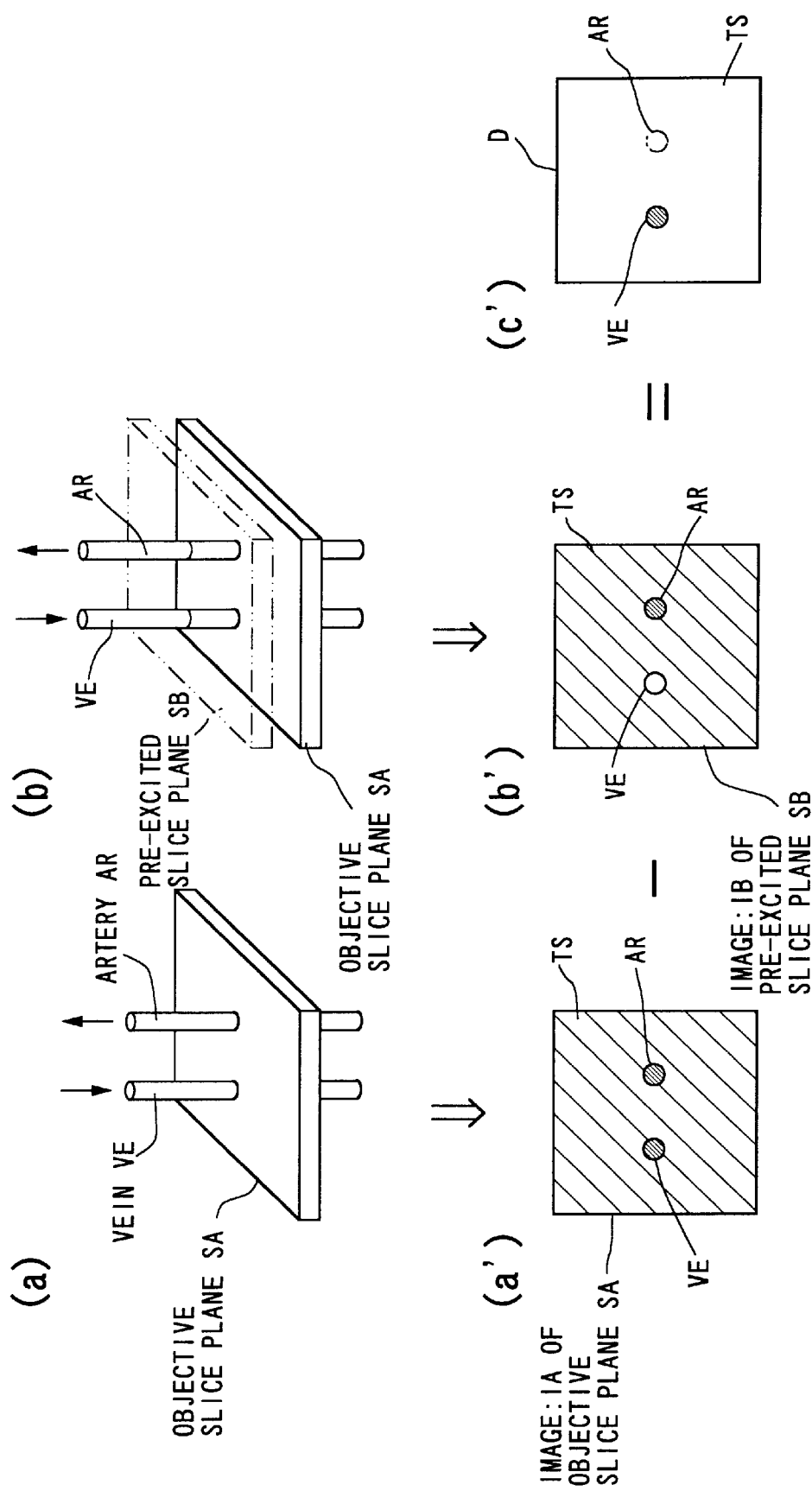
FIG. 4 is a diagram illustratively explaining, in association with each of the former and latter pulse sequences composing the whole scan sequence, the procedures of processing for a subtraction image according to the first embodiment.

In the former pulse sequence PS-A, at first, a selective excitation is executed at an imaging slice plane SA (at a desired slice position with a desired slice thickness: refer to FIG. 4 (a)) by applying an excitation RF pulse of a flip angle of, for example, 60 degrees concurrently with the slice gradient $G_s$. In this embodiment, the strength of the slice gradient $G_s$ and the frequency bandwidth $BW=f_A$ of the excitation RF pulse are specified such that the selective excitation plane is positioned at a desired objective slice in the slicing direction.

As the next step, the read-out gradient $G_R$ constituting a rephase pulse $P_{rep}$ for rephasing spin phases and the phase-encoding gradient $G_E$ are applied, and the read-out gradient $G_R$ is phase-reversed. A Field Echo signal, which is generated responsively to the gradient polarity reverse, is acquired through the RF coil 7.

In the latter pulse sequence subsequent to the former pulse sequence, at first, a pre-exciting (pre-saturation) pre-pulse is applied. By way of an example, the pre-pulse is formed as an exciting RF pulse of a flip angle of 90 degrees and of the sinc function. The 90-degrees RF pulse is applied concurrently with a pulse of the slice gradient $G_S$ for selective excitation. A pre-excited slice plane SB, to which the 90-degrees RF pulse is applied as the pre-pulse, as shown in FIG. 4(b), is allocated so as to be adjacent or approximately adjacent to the objective slice plane SA by differentiating the pre-pulse from the exciting RF pulse in the frequency bandwidth thereof; that is, the bandwidth BW of the pre-pulse is $f_B$. In this embodiment, a feature is that the pre-excited slice plane SB is set at a specified side of the objective slice plane SA, into which a vein VE inflows (namely, from which an artery AR outflows). Such technique using the pre-pulse is frequently referred to as B-FAST (blood flow suppression technique) imaging.

In the latter pulse sequence PS-B, after the above pre-excitation, pulses using a rephase pulse $P_{rep}$ and being based on the FE-method are applied to the desired objective slice plane SA, like the former pulse sequence PS-A.

This series of pulses is repeatedly applied to the two slice planes SA and SB adjacent or approximately adjacent to each other, with different phase-encoding amounts realized by the phase-encoding gradient $G_E$, and an echo signal emanating from each slice plane is acquired.

The echo signals thus-acquired are formed by the receiver 8R into digital echo data, which are then sent to the arithmetic operation unit 10. The unit 10 will execute image by image a series of steps shown in FIG. 3.

Specifically, the arithmetic operation unit 10 allocates sequentially the input echo data in each of two-dimensional two virtual memory spaces A and B in agreement with phase-encoding amounts. That is, echo data acquired by executing the former pulse sequence PS-A are mapped in one memory space A, while echo data acquired by executing the latter pulse sequence PS-B in the remaining memory space B (refer to steps ST1 to ST5 in FIG. 3).

Figure 3:
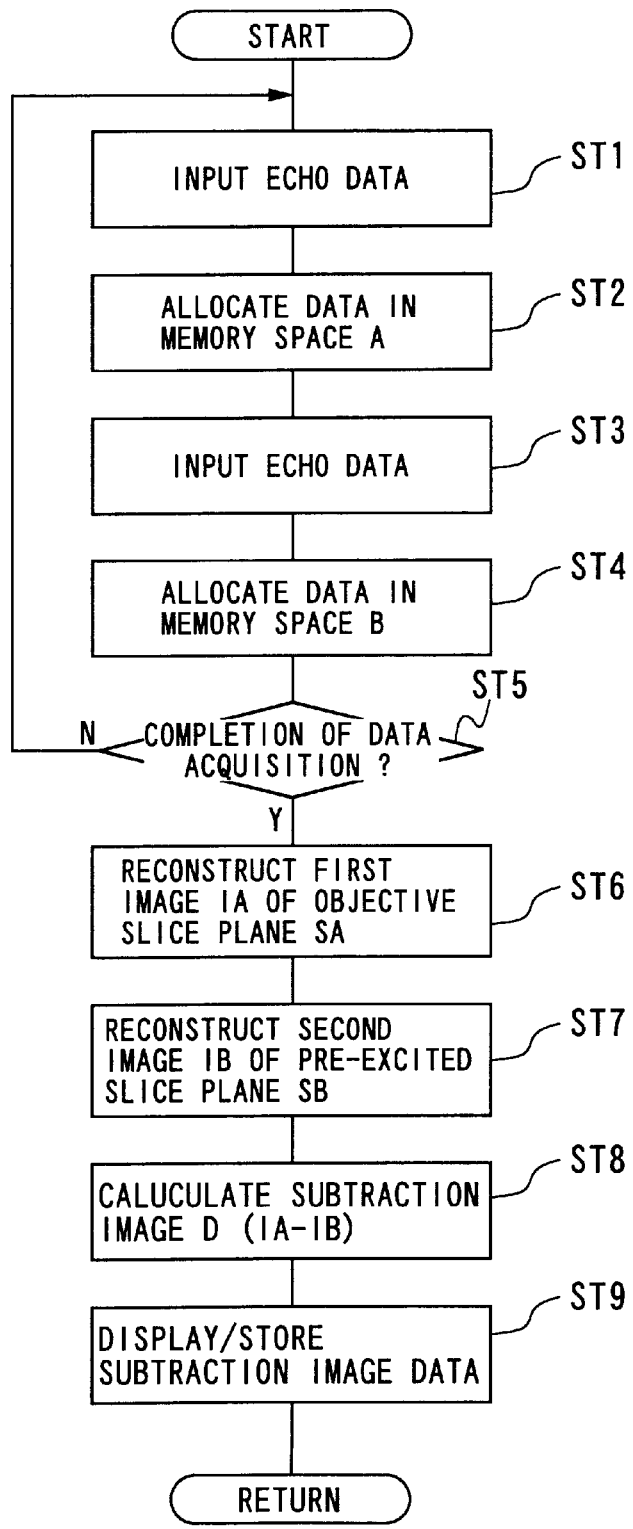
FIG. 3 is a flowchart outlining an example of processing to be executed by an arithmetic operation unit in the first embodiment.

Then, the mapped echo data of one memory space A are Fourier-transformed, reconstructing the first image IA showing the objective slice plane SA (step ST6 in FIG. 3). Moreover, the mapped echo data of the remaining memory space B are Fourier-transformed, reconstructing the second image IB showing the same objective slice plane SA (step ST7 in FIG. 3).

After the reconstruction, the arithmetic operation unit 10 subtracts pixel by pixel the pixel values of the second image IB from those of the first image IA (step ST8 in FIG. 3). Alternatively, the subtraction of the first image IA from the second image IB may be performed in the same manner as above. The subtraction provides data of a single two-dimensional subtraction image D reflected from the first and second images SA and SB, the data of the image D being stored into the storage unit 11 and displayed by the display unit 12 (step ST9 in FIG. 3).

Therefore, as shown in FIG. 4, with the desired objective slice plane SA being slice-selected by the former pulse sequence PS-A, the plane SA is scanned with the rephase pulse $P_{rep}$, thus providing the first image IA, as shown in FIG. 4($a'$). The first image IA allows a vein VE and an aorta AR both passing the slice plane SA to be imaged in cross section together with the tissue section TS. The cross sections of the blood vessels VE and AR are more contrast-enhanced than the tissue section, thanks to the time of flight effect. Since the rephase pulse $P_{rep}$ is used, the phases of spins in flows of blood become a null or approximately null. This steady rephasing provides higher intensities of echo signals emanating from flows of blood, providing higher contrast.

Subsequently, the latter pulse sequence PS-B is executed, providing the second image IB. At the beginning of this sequence PS-B, the 90-degrees RF pulse is applied as a pre-saturation pulse, which slice-selects the pre-excited slice plane SB adjacent or approximately adjacent to the above-described objective slice plane SA at the vein-inflowing side of the objective slice plane SA. The pre-excited slice plane SB is pre-excited by the pre-pulse.

The pre-excitation allows excitation of nuclear spins residing within the pre-excited slice plane SB. Therefore, the spins in the vein VE passing through the slice plane SB are saturated prior to entering the objective slice plane SA. The pre-saturation is kept when the spins of the vein VE have entered into the objective slice plane SA. Although the latter pulse sequence uses the rephase pulse for the objective slice plane SA, the saturation of spins of the vein VE provides substantially no cross-sectional image of the vein VE in the second image IB, as shown in FIG. 4($b'$).

Therefore, the subtraction image D, produced by subtracting the second image IB from the first image IA, is pictorially illustrated as in FIG. 4($c'$). The pixel values of the tissue section TS, which provides the background in the cross-sectional image of blood vessels, suitably disappear due to the subtraction, equivalently providing an image in which signals emanating from fat and/or muscle are almost completely suppressed and providing the cross sectional image D in which the vein VE and aorta AR sensitive to the rephase pulse are visually separated and enhanced.

Figure 5:
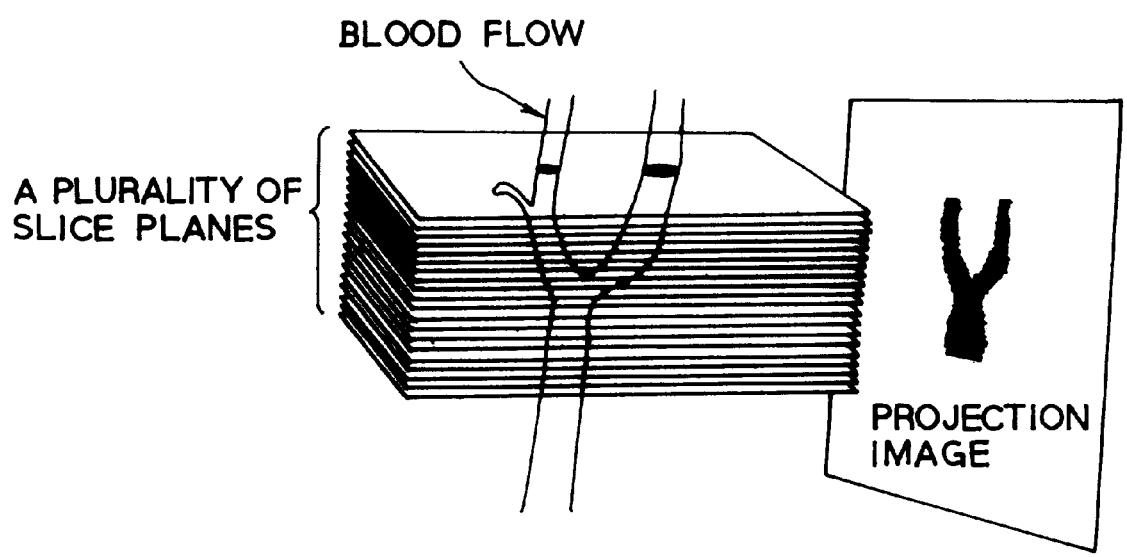
FIG. 5 is an illustration showing the positional relationship between a plurality of two-dimensional blood flow images virtually piled up three-dimensionally and its maximum intensity projection image.

The above processing is, for example, executed sequentially for each of a plurality of objective slice planes, and subtraction images obtained from each objective slice plane are three-dimensionally synthesized, as shown in FIG. 5. Using the three-dimensional volume data, for example, a MIP image is produced or rotational display is carried out, in which the background almost disappears. Hence, flows of blood in images are improved in visibility.

In the first embodiment, unlike the MR angiography according to conventional subtraction approaches, one time of imaging provides a cross sectional image in which arteries and veins are steadily visually-separated with signals from fat fully suppressed. Such an image is particularly effective in examination of the separation region of the spinal portion. Yet, because data acquisition based on a plurality of two-dimensional objective slice planes can supply three-dimensional volume data, it is superior to the usual volume imaging in that resistance against artifacts caused from body motions of a patient is greater.

(Second embodiment)

A second embodiment of the present invention will be described with reference to FIGS. 6 and 7. The second embodiment will also realize an MRI system based on the similar imaging approach to that in the first embodiment, except the position at which the pre-excited slice plane is set differently. The MRI system according to the second embodiment is the same in the hardware configuration as that described in the first embodiment.

Figure 6:
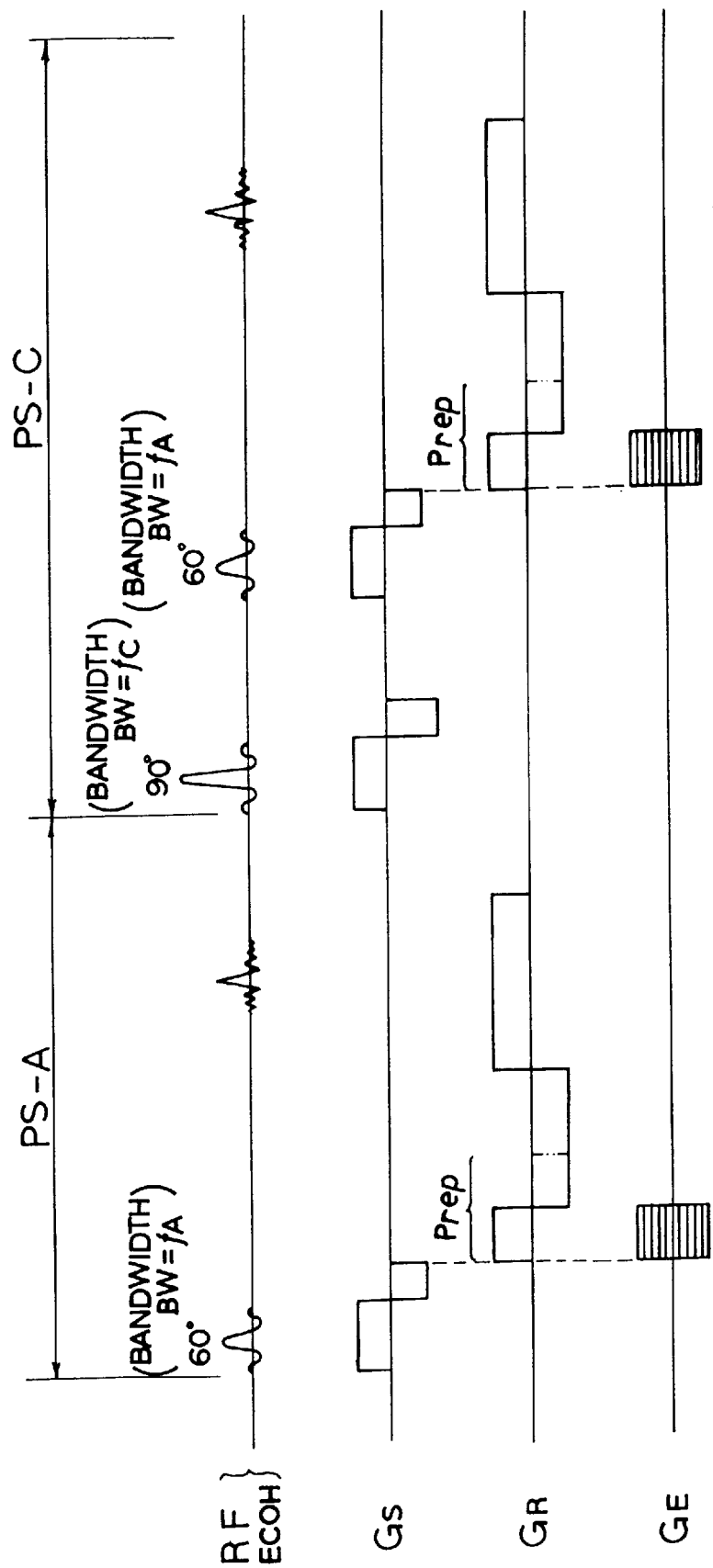
FIG. 6 is an example of a whole scan sequence to be executed in a second embodiment of the invention.
Figure 7:
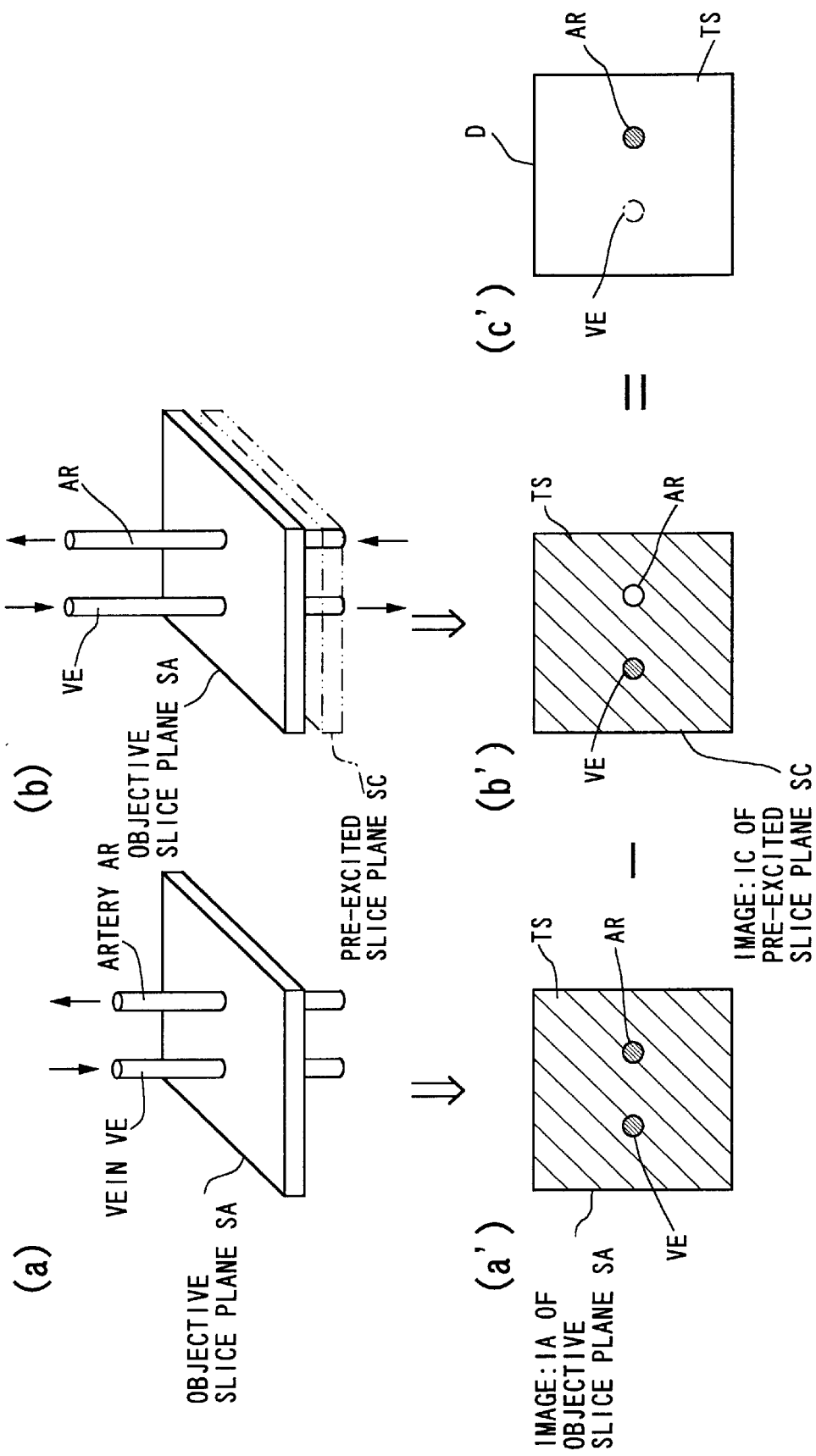
FIG. 7 is a diagram illustratively explaining, in association with each of the former and latter pulse sequences composing the whole scan sequence, the procedures of processing for a subtraction image according to the second embodiment.

The MRI system of this embodiment comprises the controller 6 and sequencer 5 which execute in a cooperative manner a scan sequence shown in FIG. 6. The scan sequence is also composed of, every phase-encoding amount, a former pulse sequence PS-A and a latter pulse sequence PS-C, which form a two-stage scan. The former pulse sequence PS-A is the same in pulse trains as that in the first embodiment, which uses the rephase pulse to perform the echo signal acquisition based on the FE method.

The latter pulse sequence PS-C uses a 90-degees RF pulse employed as the pre-pulse for pre-saturation, which is first applied at a specified slice plane. This pre-excited slice plane SC is, as shown in FIG. 7($b$), positioned at an artery-inflowing side (i.e., vein-outflowing side) of a desired objective slice plane SA in an adjacent or approximately adjacent to the plane SA. The position of the pre-excited slice plane SC is realized by previously setting the frequency bandwidth BW of the pre-pulse into a desired bandwidth $f_C$. The pre-pulse is followed by, like the first embodiment, an exciting RF pulse applied to the objective slice plane SA. After this, like the first embodiment, a rephase pulse is applied to the objective slice plane to acquire an echo signal in conjunction with the FE pulse train.

Such echo data acquisition is repeatedly and sequentially performed with controlled phase-encoding amounts. The arithmetic operation unit 10 produces, by reconstructing echo data from each of the pulse sequences PA-A and PS-C, into the first image IA and second image IC, respectively, as shown in FIGS. 7(*a*') and (*b*'). The unit 10 additionally executes pixel by pixel the subtraction of "IA-IC" between the two frames of the first and second images IA and IC. The resultant pixel data D, by contrast with the first embodiment, become a cross sectional image in which most of the tissue portion TS contributing the background and the cross section of the vein VE disappear from the subtracted image, while leaving only the clear cross section of the artery AR.

Therefore, differently from the first embodiment, only the arteries can effectively be displayed. As described, depending on setting a pre-excited slice plane at which side of an objective slice plane, the type of blood flow inflowing into the objective slice plane can be altered arbitrarily, providing the imaging of blood vessels according to the running directions thereof, in addition to the same advantages as in the first embodiment.

(Third embodiment)

A third embodiment will now be described with reference to FIGS. 8 to 10. This embodiment also provides a scanning manner employing the same approach as described in the above embodiments, but it differs in that a plurality of pre-excited slice planes (two planes hereinafter) are set.

Figure 8:
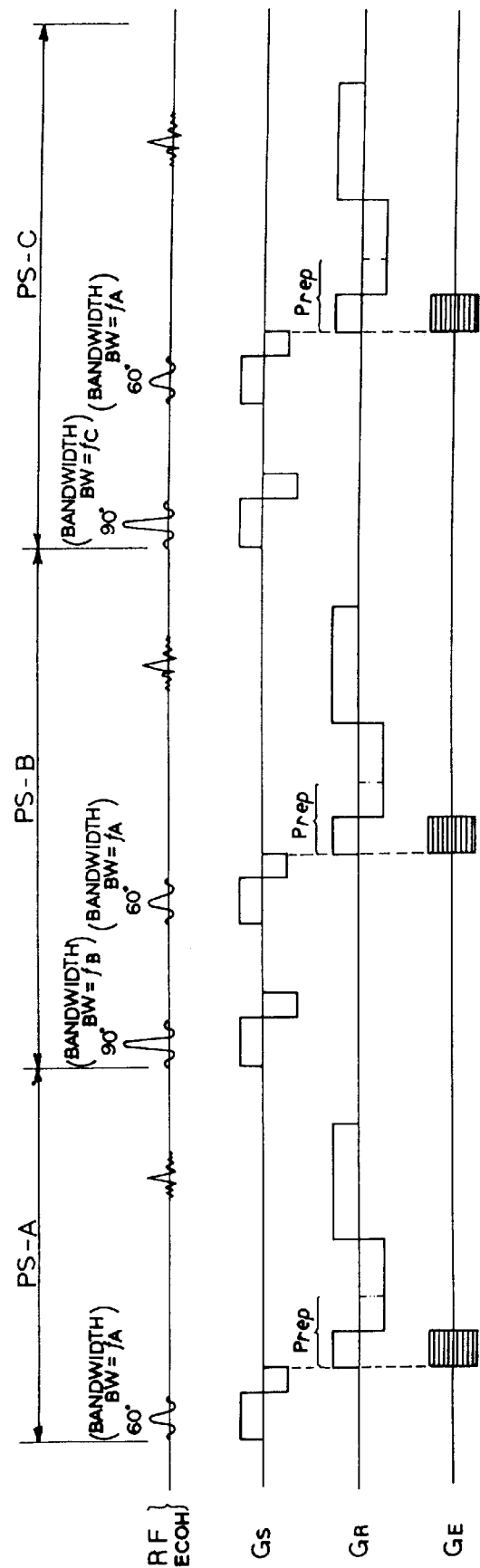
FIG. 8 is an example of a whole scan sequence to be executed in a third embodiment of the invention.

The MRI system according to this embodiment instruct the controller 6 and sequencer 5 to cooperatively execute a can sequence shown in FIG. 8. The scan sequence is, every phase-encoding amount, composed of an opening-stage pulse sequence PS-A, a middle-stage pulse sequence PS-B, and a last pulse sequence PS-C, which form a three-stage scan. The opening- and middle-stage pulse sequences PS-A and PS-B are the same as those described in the first embodiment, while the last-stage pulse sequence PS-C is the same as that in the second embodiment.

Figure 9:
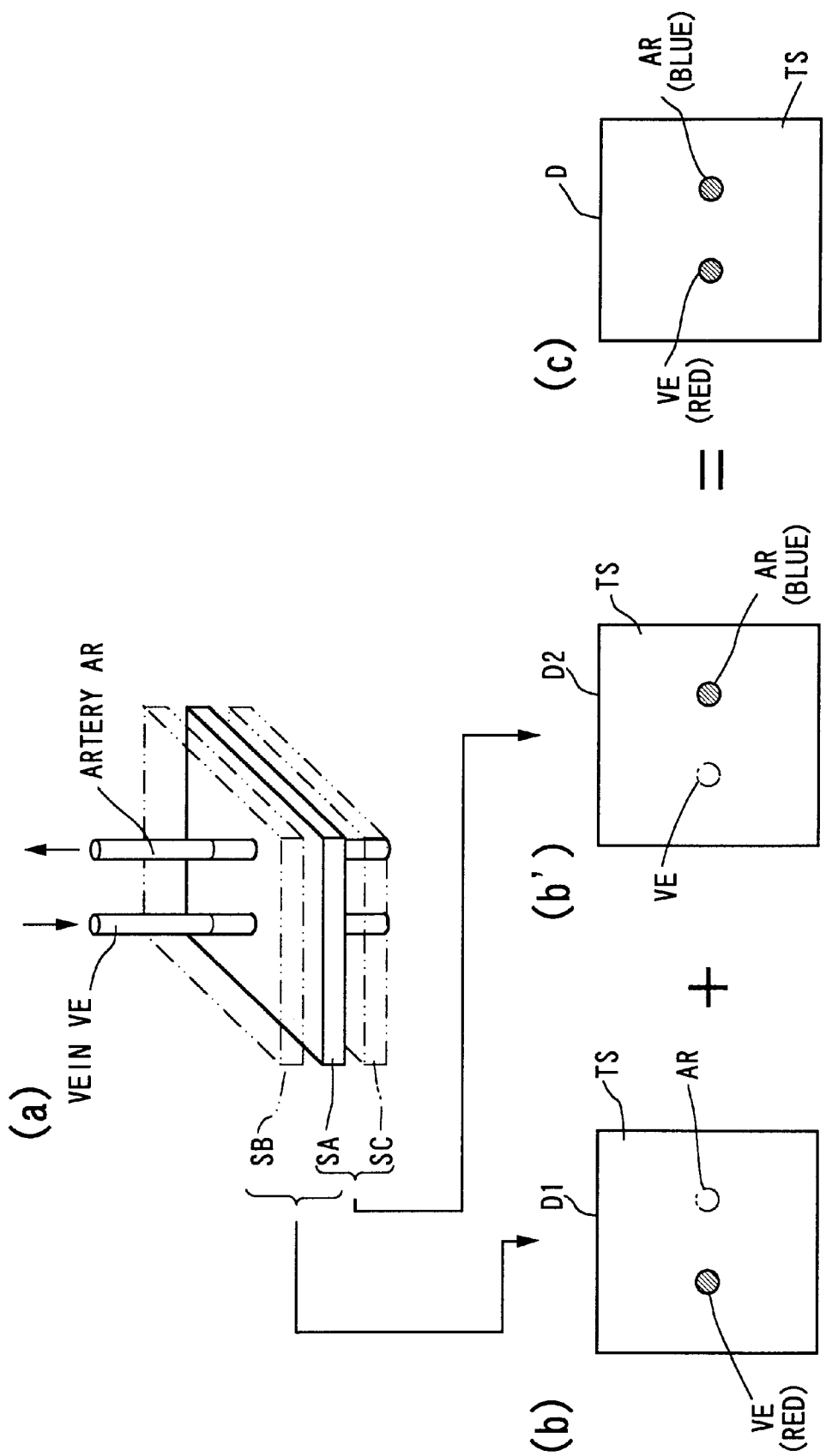
FIG. 9 is a diagram illustratively explaining, in association with each of the opening-, middle-, and last-stage pulse sequences composing the whole scan sequence, the procedures of processing for a subtraction image according to the third embodiment.

Therefore, as illustrated in FIG. 9(*a*), one of the two pre-excited slice plane SB is set at the vein-inflowing side of a desired objective slice plane SA, the remaining pre-excited slice plane SC is set at the artery-inflowing side of the plane SA. For two combinations made by the two pre-excited slice planes SB and SC and the one objective slice plane SA, echo acquisition is carried out based on the scan sequence represented by FIG. 8.

The arithmetic operation unit 10 will assign the same arithmetic operation as described before to each group of echo signals acquired from one combination of the opening- and middle-stage pulse sequence PS-A and PS-B and another one combination of the opening- and last-stage pulse sequence PS-A and PS-C. Namely, the arithmetic unit 10 produces, as schematically shown at steps ST11 to ST15 in FIG. 10, the first subtraction image D1 indicative of the cross section of a vein VE on the basis of echo data acquired by performing the opening- and middle-stage pulse sequence PS-A and PS-B (refer to FIG. 9(*b*) and FIG. 4(*c*')), and the second subtraction image D2 indicative of the cross section of an artery AR on the basis of echo data acquired by performing the opening- and last-stage pulse sequence PS-A and PS-C (refer to FIG. 9(*b*') and FIG. 7(*c*')).

Figure 10:
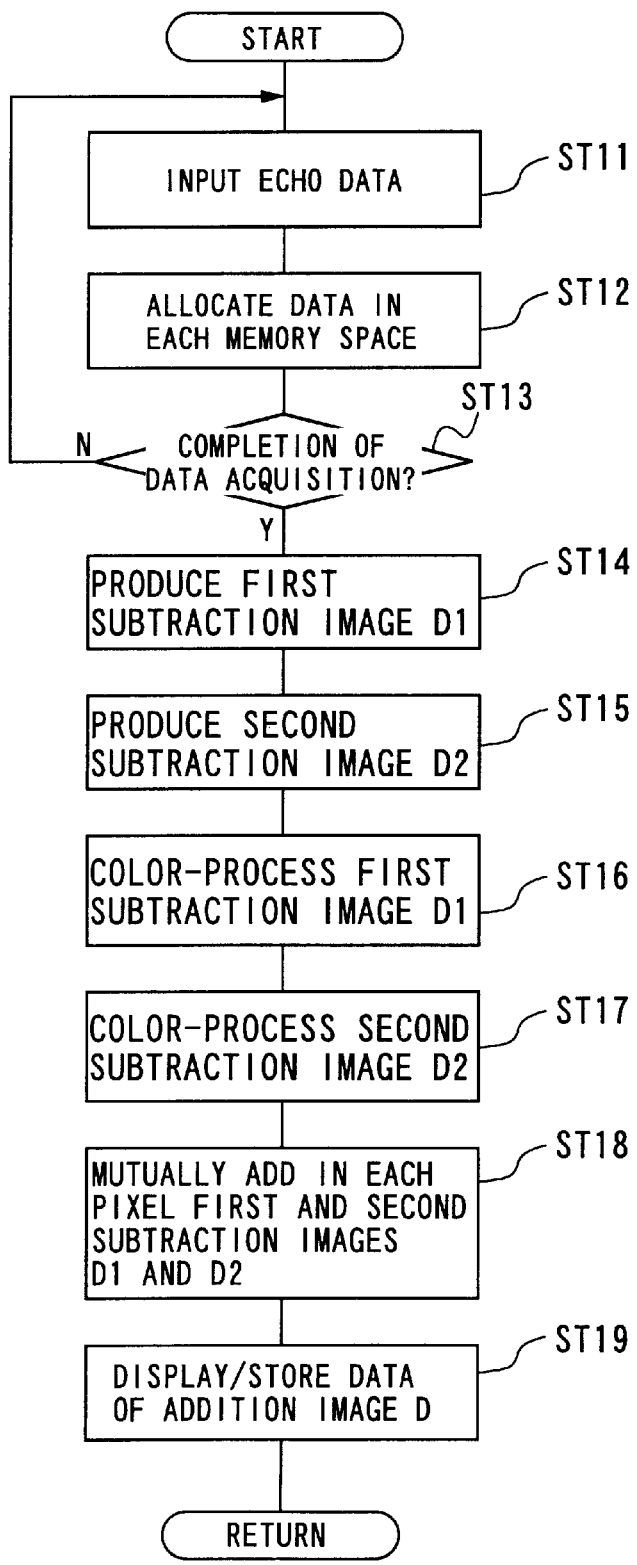
FIG. 10 is a flowchart showing an example of processing to be executed by the arithmetic operation unit in the third embodiment.

Then the arithmetic operation unit 10 provides the first and second subtraction images D1 and D2 color data different from each other (steps ST16 and ST17 in FIG. 10). The color data are hue data, for example. By way of an example, in the first subtraction image D1, color data of red are provided to pixels having pixel values (brightness levels) of more than a desired threshold, thus enabling at least the vein VE to have color data of red in the first subtraction image D1. Also in the second subtraction image D2, color data of blue are provided to pixels having pixel values (brightness levels) of more than a desired threshold, thus enabling at least the artery AR to have color data of blue in the second subtraction image D2.

Then the unit 10 adds pixel by pixel the first and second subtraction images D1 and D2 to each other (step T18). The data of the added image D are displayed by the display unit 12 and stored into the storage unit 11.

As a result, as shown in FIG. 9(*c*), there is provided a cross section image of blood flow in which the vein VE and artery AR are colored in different hues. In addition to having the equivalent advantages to the foregoing embodiments, it is possible to enrich blood flow imaging techniques. Particularly, both of the veins and arteries passing through a desired objective slice can be color-displayed at one time, thus increasing the discrimination ability with respect to the running positions of blood flow and running directions thereof, which makes easier to visually separate vein/artery flows from each other. Thus it is effective in interpreting the distinction of type of blood vessels, running positions of thereof, or the like.

The coloring approach is not limited to that described above. For each subtraction image data, arbitrary hues can be given; in each subtraction image data, hues can be changed depending on the magnitudes of the pixels values; and for each subtraction image data, color data co-using changed brightness levels and hues can be given.

Still the application order of the three opening-, middle-, and last-stage pulse sequences PS-A to PS-C which has been explained is just one example, and the application order is changeable.

(Fourth embodiment)

A fourth embodiment will now be explained in conjunction with FIG. 11. This embodiment employs an ECG-gated technique in the imaging technique described in the third embodiment.

As described before, the ECG unit 18 can supply to the controller 6 and sequencer 5 gate pulses as electrocardiographic-synchronizing signals produced from the ECG signal of a patient P. The ECG signal is a representative of signals representing cardiac time phases of a patient. In this embodiment, the sequencer 5 therefore uses the gate pulses to perform a prospective gating technique as one of the electrocardiographic-synchronizing techniques.

Figure 11:
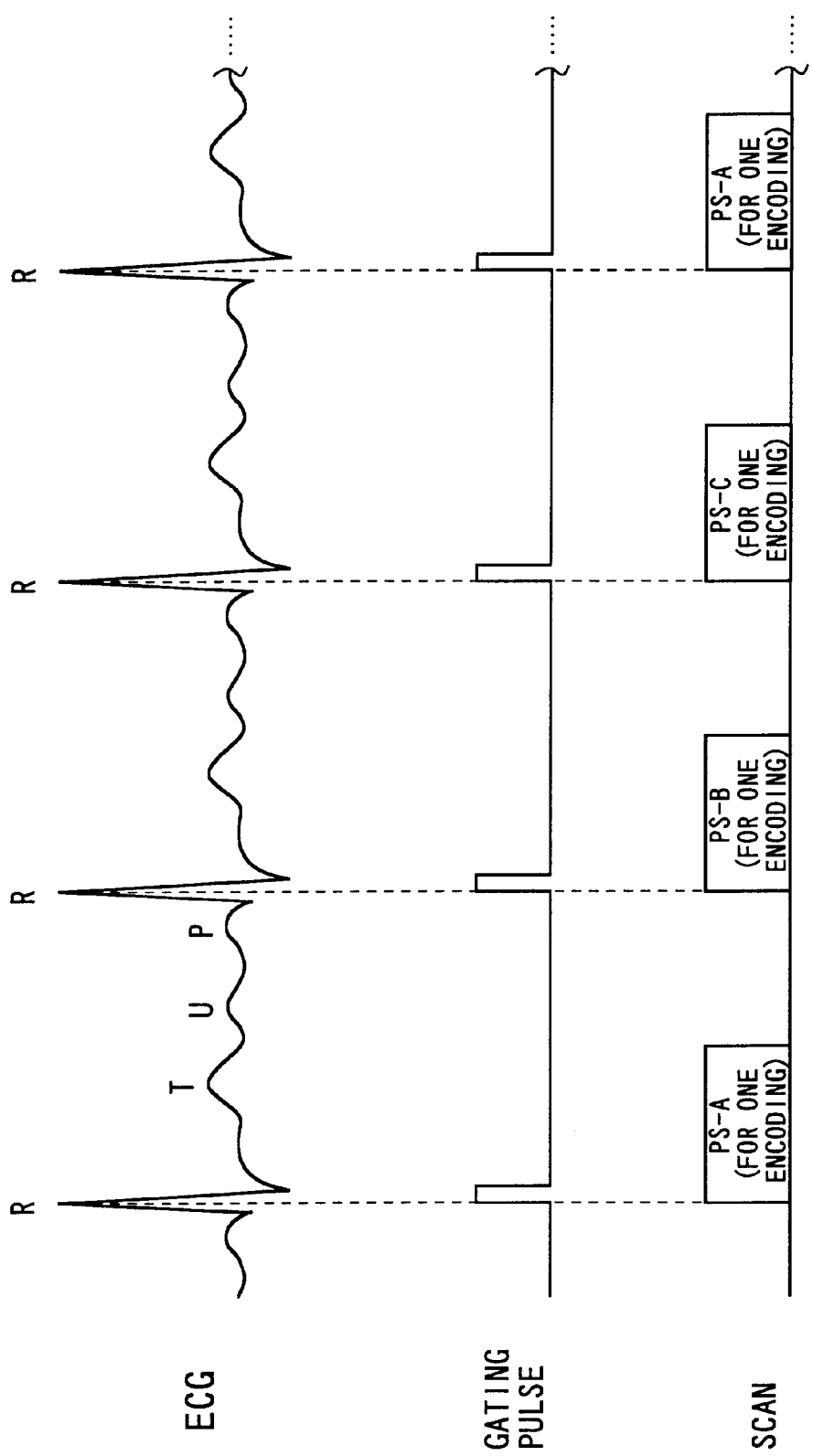
FIG. 11 pictorially illustrates the temporal relationship between the execution of each pulse sequence of a whole scan sequence and ECG signals in a forth embodiment of the invention.

The sequencer 11 performs a scan sequence schematically shown in FIG. 11, in which, in response to the input of each of the gate pulses synchronizing with each peak time when each R-wave reaches its peak value in the ECG signal, the opening-, middle-, and last-stage pulse sequences PS-A, -B, and -C which have been described in the third embodiment exactly start in turn for every phase-encoding value. This approach enables the electrocardiographic-synchronizing imaging over a plurality of heart beats, with R-waves with which scans being synchronized. Therefore, during a period in which the speed of blood flows are larger due to the contribution of the contraction of the cardiac muscle and the effect of inflow (that is, the time of flight effect) is thus larger, echo signals can be increased in intensities, with the result that images of blood vessels having a higher signal to noise ratio (S/N) are steadily produced.

The electrocardiographic-synchronizing imaging using gate pules may be modified into various modes. As an example, the above prospective gating technique may be applied to the scan sequences which have been described in the first and second embodiments.

Prospective gating has been practiced as one of the electrocardiographic-synchronizing techniques in the fourth embodiment. Instead, another gating technique called "retrospective gating" may be employed, in which echo data are acquired sequentially regardless of elapsed temporal phases in the ECG signal, correspondence then being given between phase-encoding amounts and the temporal phases in the ECG signal when the echo data are mapped in the k-space for reconstruction, and mapped data are position-changed, line by line in the phase-encoding direction, for correction.

In the above embodiments, the pre-pulse is not limited to the 90-degrees RF pulse that uses the sinc function, but a variety of pulses may be used, provided that it can pre-excite a slice including flows of blood making inflow to an objective slice plane. For example, the pre-pulse may have another flip angle changed from 90-degrees or may be of a binomial pulse.

Still, the flip angle of the slice selective RF pulse in the above embodiments is not always restricted to 60-degrees, but various flip angles, preferably lower values for shortening the scan time, may be employed within an allowed range.

Further it may be also possible that the pre-excited slice plane be positioned by changing the strength of the slice gradient, with the bandwidth of the exciting RF pulse unchanged.

Still, pulse sequences based on the SE method may be adopted instead of the FE method described.

Although the description above contains many specificities, these should not be construed as limiting the scope of the invention but as merely providing illustrations of some of the presently preferred embodiments of this invention. Thus the scope of this invention should be determined by the appended claims and their equivalents.

What is claimed is:

1. An MRI system for producing a two-dimensional image of an objective plane volume of a subject, said system comprising:

first means for executing, at each of plural phase-encoded increments, a first pulse sequence set to acquire a first echo signal generated in response to selective excitation of nuclear spins in the objective plane;

second means for also executing, at each of said plural phase-encoded increments, a second pulse sequence including an initial pulse pre-exciting nuclear spins in a two-dimensional plane offset from said objective plane and set to thereafter acquire a second echo signal generated in response to selective excitation of nuclear spins in the objective plane; and means for processing said first and second echo signals into said image of the objective plane.

2. An MRI system as in claim 1, wherein each of the first and second pulse sequences includes a gradient applied in a read-out direction and including a rephase pulse formed by reversing the gradient polarity.

3. An MRI system as in claim 2, wherein the gradient applied in the read-out direction includes a read-out pulse applied after the rephase pulse based on a field echo (FE) method of MRI.

4. An MRI system as in claim 3, wherein each of the first and second pulse sequences includes an RF exciting pulse flip angle of less than 90 degrees.

5. An MRI system as in claim 1, wherein the objective plane is positioned against a flow of blood at an intersection angle of 90 degrees or thereabout.

6. An MRI system as in claim 5, wherein:

the offset two-dimensional plane is positioned at a vein-inflowing side of the objective plane, the vein being employed as the flow of blood; and the processing means comprises means for reconstructing the first echo signal into a first image of the objective plane, means for reconstructing the second echo signal into a second image of the objective plane, and means for subtracting each corresponding pixel value in the second image from its counterpart in the first image to produce a subtraction image.

7. An MRI system as in claim 5, wherein the offset two-dimensional plane is positioned at an artery-inflowing side of the objective plane, the artery being employed as the flow of blood; and the processing means comprises means for reconstructing the first echo signal into a first image of the objective plane, means for reconstructing the second echo signal into a second image of the objective plane, and means for subtracting each corresponding pixel value in the second image from its counterpart in the first image to produce a subtraction image.

8. An MRI system as in claim 5, wherein:

the offset two-dimensional plane is positioned both at a vein-inflowing side and at an artery-inflowing side of the objective plane, the vein and artery being employed as the flow of blood, means for executing the second pulse sequence for each of the vein-inflowing and artery-inflowing side planes, and means for individually commanding echo signal acquisition in response to selective excitation of the objective plane after the initial pulse has been applied to each of the vein-inflowing and artery-inflowing side offset planes; and the processing means comprises means for reconstructing the first echo signal into a first image of the objective plane, means for reconstructing a second echo signal in response to the application of an initial pulse to a vein-inflowing side offset plane into a second image of the objective plane, means for reconstructing a third echo signal in response to the application of an initial pulse to the artery-inflowing side offset plane into a third image of the objective plane, means for subtracting a corresponding pixel value in the second image from its counterpart in the first image to produce a first subtraction image, means for subtracting a corresponding pixel value in the third image from its counterpart in the first image to produce a second subtraction image, and means for adding a corresponding pixel value in the first and second subtraction images with each other to produce an addition image.

9. An MRI system as in claim 8, wherein the processing means comprises means for assigning to the first and second subtraction image differentiated color data depending on the pixel values of each of the first and second subtraction images.

10. An MRI system as in claim 1, further comprising:

means for detecting a signal indicative of a cardiac time phase of the subject and producing a gating signal from the detected signal, wherein the first and second executing means comprise means for synchronizing start timing of the first and second pulse sequences with the gating signal, respectively.

11. An MRI system as in claim 10, wherein the signal indicative of the cardiac time phase is an electrocardiograph (ECG) signal of the subject.

12. An MRI system as in claim 11, wherein each of the first and second pulse sequences includes a gradient applied in a read-out direction that includes a rephase pulse formed by reversing the gradient polarity.

13. An MRI system as in claim 12, wherein the gradient applied in the read-out direction includes a read-out pulse applied after the rephase pulse based on a field echo (FE) method of MRI.

14. An MRI system as in claim 13, wherein each of the first and second pulse sequences includes an RF exciting pulse flip angle of less than 90 degrees.

15. An MRI system as in claim 11, wherein the offset plane is positioned at a vein-inflowing side of the objective plane, the vein being employed as the flow of blood; and the processing means comprises means for reconstructing the first echo signal into a first image of the objective plane, means for reconstructing the second echo signal into a second image of the objective plane, and means for subtracting each corresponding pixel value in the second image from its counterpart in the first image to produce a subtraction image.

16. An MRI system as in claim 11, wherein the offset plane is positioned at an artery-inflowing side of the objective plane, the artery being employed as the flow of blood; and the processing means comprises means for reconstructing the first echo signal into a first image of the objective plane, means for reconstructing the second echo signal into a second image of the objective plane, and means for subtracting each corresponding pixel value in the second image from its counterpart in the first image to produce a subtraction image.

17. An MRI system as in claim 11, wherein an offset plane is positioned both at a vein-inflowing side and at an artery-inflowing side of the objective plane, the vein and artery being employed as the flow of blood, including:

means for executing the second pulse sequence for each of the vein-inflowing and artery-inflowing side offset planes, and means for individually commanding echo signal acquisition in response to selective excitation of the objective plane after an initial pulse has been applied to each of the vein-inflowing and artery-inflowing side offset planes; and the processing means comprises means for reconstructing the first echo signal into a first image of the objective plane, means for reconstructing a second echo signal acquired in response to the application of an initial pulse to the vein-inflowing side offset plane into a second image of the objective plane, means for reconstructing a third echo signal acquired in response to the application of an initial pulse to the artery-inflowing side offset plane into a third image of the objective plane, means for subtracting corresponding pixel values in the second image from their counterparts in the first image to produce a first subtraction image, means for subtracting corresponding pixel values in the third image from their counterparts in the first image to produce a second subtraction image, and means for adding corresponding pixel values in the first and second subtraction images with each other in order to produce an addition image.

18. A method of MR imaging for producing a two dimensional image of an objective plane of a subject, said method comprising the steps of:

executing, at each of plural phase-encoded increments, a first pulse sequence set to acquire a first echo signal generated in response to selective excitation of nuclear spins in the objective plane and a second pulse sequence including an initial pre-exciting pulse in a two-dimensional plane offset from the objective plane and set to acquire a second echo signal generated in response to selective excitation of nuclear spins in the objective plane; and processing said first and second echo signals into said image of the objective plane.

19. A method as in claim 18, wherein each of the first and second pulse sequences includes a gradient pulse applied in a read-out direction including a rephase pulse formed by reversing the gradient pulse polarity.

20. A method as in claim 19, wherein the gradient pulse includes a read-out pulse based on a field echo (FE) MRI method applied after the rephase pulse.

21. An MRI system for producing a two-dimensional image of an objective plane in a subject located in a static magnetic field, said system comprising:

an RF coil for transmitting an RF magnetic field to the object and for detecting an echo RF signal emanated from the object;

a transmitter connected to drive the RF coil to transmit the RF magnetic field;

a receiver connected to receive the echo RF signal from the RF coil;

gradient coils disposed to generate gradient magnetic field pulses superposed on the static magnetic field;

a gradient power supply connected to drive the gradient coils to generate the gradient pulses;

a control system connected to control the transmitter, receiver, and gradient power supply so as to execute a first pulse sequence set to acquire a first echo signal in response to selective excitation of nuclear spins in the objective plane and a second pulse sequence including an initial pre-pulse exciting nuclear spins in a two-dimensional plane offset in a slice position from the objective plane and being set to acquire a second echo signal generated in response to selective excitation of nuclear spins in the objective plane after application of the pre-pulse; and a processor for processing the first and second echo signals into an image of the objective plane.

22. An MRI system as in claim 21, wherein the control system causes the offset plane to be positioned at a vein-inflowing side of the objective plane, the vein serving as the flow of blood; and the processor reconstructs the first echo signal into a first image of the objective plane, reconstructs the second echo signal into a second image of the objective plane, and subtracts, pixel-by-pixel, the second image from the first image to produce a subtraction image.

23. An MRI system as in claim 21, wherein the control system causes the offset plane to be positioned at an artery-inflowing side of the objective plane, the artery serving as the flow of blood; and the processor reconstructs the first echo signal into a first image of the objective plane, reconstructs the second echo signal into a second image of the objective plane, and subtracts, pixel-by-pixel, the second image from the first image to produce a subtraction image.

24. An MRI system as in claim 21, wherein the control system causes an offset plane to be positioned both at a vein-inflowing side and at an artery-inflowing side of the objective plane, the vein and artery serving as the flow of blood, the second pulse sequence being executed for each of the vein-inflowing and artery-inflowing side offset planes, and echo signal acquisition in response to selective excitation of the objective plane after a pre-pulse has been applied to the vein-inflowing and artery-inflowing side planes is individually commanded; and the processor reconstructs the first echo signal into a first image of the objective plane, reconstructs the echo signal in response to the application of a pre-pulse to the vein-inflowing side offset plane into a second image of the objective plane, reconstructs the echo signal in response to the application of a pre-pulse to the artery-inflowing side offset plane into a third image of the objective plane, subtracts, pixel-by-pixel, the second image from the first image to produce a first subtraction image, subtracts, pixel-by-pixel, the third image from the first image to produce a second subtraction image, and adds, pixel-by-pixel, the first and second subtraction images with each other to produce an addition image.

25. An MRI method for producing an image of fluid flow in a subject body, said method comprising:

obtaining NMR echo data from a subject body using an imaging sequence of RF and magnetic gradient pulses which define plural images of the same body portion, subjecting flowing fluid matter within said body portion to a different NMR process than relatively stationary matter within said body portion during a portion of said imaging sequence associated with echo data for at least one of said images; and combining data representing said plural images into a single common image of said body portion wherein the image of flowing fluid matter is enhanced with respect to relatively stationary matter.

26. An MRI method as in claim 25 wherein at least one image data gathering subsequence of said imaging sequence includes an extra NMR RF pulse selectively applied to flowing fluid matter at a location offset from said same body portion thereby affecting a subsequent NMR response of the flowing fluid matter when and if it passes into said same body portion.

27. An MRI method as in claim 25 wherein:

said echo MRI data is processed into plural images of said same body portion, and said combining step includes arithmetic subtraction of one such image from another such image on a pixel-by-pixel basis.

28. An MRI method as in claim 26 wherein:

said echo MRI data is processed into plural images of said same body portion, and said combining step includes arithmetic subtraction of one such image from another such image on a pixel-by-pixel basis.

29. An MRI method as in claim 25 wherein said imaging sequence elicits NMR gradient field echoes.

30. An MRI method as in claim 25 wherein said imaging sequence elicits NMR spin echoes.

31. AN MRI method as in claim 25 wherein pixels of said common image are given color display values representing the polarity and/or magnitude of the differences between respectively corresponding pixels of said plural images.

32. An MRI method for imaging fluid flow within a subject body, said method comprising:

(i) eliciting a first NMR echo from a predetermined patient volume;

(ii) subjecting relatively flowing nuclei to an NMR process upstream of said predetermined patient volume to influence subsequent NMR responses thereof;

(iii) eliciting a second NMR echo from said predetermined patient volume including said flowing nuclei after a time of flight depending upon flow velocity;

(iv) repeating steps (i), (ii) and (iii) to acquire sufficient first and second echo data to define respective first and second images of said predetermined patient volume;

(v) processing detected RF signals representing said first and second NMR echoes to produce corresponding first and second image data for said predetermined patient volume; and (vi) subtracting respectively corresponding pixel values of said first and second image data to produce composite image data representing an image of said flowing fluid within said predetermined patient volume that is enhanced with respect to relatively stationary NMR nuclei.

33. An MRI method as in claim 32 wherein said elicited echoes are gradient field echoes.

34. An MRI method as in claim 32 wherein said elicited echoes are spin echoes.

35. An MRI method as in claim 25 wherein pixels of said composite image data are given color display values representing the polarity and/or magnitude of the differences between respectively corresponding pixels of said first and second image data.

36. An MRI method as in claim 32 further comprising, as part of steps (ii), (iii), (iv) and (v):

(ii) subjecting said relatively flowing upstream nuclei on two opposite sides of said predetermined patient volume to an NMR process that influences subsequent NMR responses thereof; and (iii) also eliciting a third NMR echo from said predetermined patient volume including said flowing nuclei after a time of flight depending upon flow velocity;

(v) also processing detected RF signals representing said third NMR echoes to produce corresponding third image data for said predetermined patient volume; and (vi) also subtracting respectively corresponding pixel values of said first and second image data to produce second composite image data representing an enhanced image of fluid flowing in an opposite direction within said predetermined patient volume.

37. An MRI method as in claim 36 further comprising adding together said composite images to provide a further composite image simultaneously depicting fluid flows in two opposite directions within said predetermined patient volume.

38. An MRI method as in claim 37 wherein pixels of said further composite image data are given color display values representing the polarity and/or magnitude of the differences between respectively corresponding pixels of said first and second image data.

* * * * *